(12) United States Patent
Beintner (10) Patent No.: US 7,101,755 B2
(45) Date of Patent: Sep. 5, 2006

(54) GATE CONDUCTOR ISOLATION AND METHOD FOR MANUFACTURING SAME

(75) Inventor: Jochen Beintner, Wappingers Falls, NY (US)

(73) Assignee: Infineon Technologies AG, Munich (DE)

( * ) Notice: Subject to any disclaimer, the term of this patent is extended or adjusted under 35 U.S.C. 154(b) by 195 days.

(21) Appl. No.: 10/912,005

(22) Filed: Aug. 5, 2004

(65) Prior Publication Data

US 2006/0030106 A1 Feb. 9, 2006

(51) Int. Cl.
*H01L 21/8242* (2006.01)

(52) U.S. Cl. ........................ 438/243; 438/248; 438/386

(58) Field of Classification Search ................ 438/243, 438/248, 386

See application file for complete search history.

(56) References Cited

U.S. PATENT DOCUMENTS 6,635,526 B1 * 10/2003 Malik et al. ................ 438/243

\* cited by examiner

*Primary Examiner*—Jack Chen
(74) *Attorney, Agent, or Firm*—Edell, Shapiro & Finnan, LLC (57) ABSTRACT

A method for processing a semiconductor device includes providing the semiconductor device including a deep trench transistor in an array area and a shallow trench isolation oxide in a support area, wherein a pad oxide and pad nitride are sequentially formed on a semiconductor substrate. The method includes stripping the pad nitride, depositing an array top oxide layer over the pad oxide formed on the semiconductor substrate in the array area and the support area, and planarizing the array top oxide to a top of the shallow trench isolation oxide in the support area and to a deep trench poly stud of the deep trench transistor in the array area. The method further includes forming a wordline stack comprising a nitride layer, a gate conductor and an insulator, and etching the array top oxide, forming a passing wordline bridge through the array area supported on the shallow trench isolation oxide.

6 Claims, 7 Drawing Sheets

GATE CONDUCTOR ISOLATION AND METHOD FOR MANUFACTURING SAME

BACKGROUND OF THE INVENTION

1. Field of the Invention

The present invention relates to the manufacture of semiconductor devices, and more particularly to a gate conductor isolation process of a vertical DRAM cell.

2. Discussion of Related Art

The manufacture and design of integrated circuits has greatly increased in sophistication, including the isolation of gate conductors. Increased integration density leads to economic advantages as increased numbers of devices and circuits may be placed on a single chip and/or within a single package (which may include a plurality of chips). Performance improvements such as achieved as integration density is increased may be due to a reduction in length of signal paths, capacitance between connections and the like. The performance gain is important in integrated circuits.

Integrated circuits such as dynamic access memories (DRAMs) can have millions of similar devices on a single chip, collectively referred to as an array or array portion of the chip design. The devices are controlled throughout the chip or partitions thereof by circuits such as addressing circuits, sense amplifiers and the like, referred to as support circuits.

Circuit requirements may be different for the array and support regions of the chip, and may need different processes during manufacture. For example, the current integration process for vertical array DRAM results in an insufficient process window for the formation of an array top oxide needed for the isolation of passing wordline to an active area.

In view of the foregoing and other problems of chip architecture, a need exists for a method for a gate conductor isolation process for a semiconductor memory device, the memory device including an array area and a support area.

SUMMARY OF THE INVENTION

A method for processing a device includes a post pad nitride strip and array implant. An ATO layer, such as SiGe, is deposited over the array and support areas. The ATO is processed by chemical mechanical planarization to a shallow trench isolation oxide layer in a support area and to the deep trench poly stud in an array area. A nitride cap is deposited and structured. The ATO is etched in the support area. The support area is further processed with well implants, gate oxidation, and a first polysilicon layer deposition. The first polysilicon is structured. The nitride cap is stripped, the deep trench poly stud is cleaned and a gate conductor, for example, a second polysilicon layer, Tungsten Silicide (WSi), or nitride is deposited. The gate conductor is etched. An isotropic selective SiGe etch is performed to create a passing wordline on the shallow trench isolation oxide.

According to an embodiment of the present disclosure a method for processing a semiconductor device includes providing the semiconductor device including a deep trench transistor in an array area and a shallow trench isolation oxide in a support area, wherein a pad oxide and pad nitride are sequentially formed on a semiconductor substrate. The method includes stripping the pad nitride, depositing an array top oxide layer over the pad oxide formed on the semiconductor substrate in the array area and the support area, and planarizing the array top oxide to a top of the shallow trench isolation oxide in the support area and to a deep trench poly stud of the deep trench transistor in the array area. The method further includes forming a wordline stack comprising a nitride layer, a gate conductor and an insulator, and etching the array top oxide, forming a passing wordline bridge through the array area supported on the shallow trench isolation oxide.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

In an exemplary embodiment of the present disclosure, a method includes removing from an array area and a support area a pad nitride material formed on the device. The initial pad nitride material in the support area, however, can still optionally be maintained. Active device areas are then formed within the array area. Silicon Germanium (SiGe) is deposited and a chemical mechanical planarization process is performed down to the shallow trench isolation oxide and deep trench ploy stud. A post pad nitride strip is performed and array implants may be formed. A SiGe layer is deposited over the array and support areas. Chemical mechanical planarization is done down to the shallow trench isolation oxide layer in the support area and down to the deep trench poly stud in the array area. A nitride cap is deposited, structured, and SiGe poly etched in the support area.

According to an embodiment of the present disclosure, a nitride/oxide cap is deposited, structured and pad nitride etched in the support area. The support area is further processed with well implants, gate oxidation, and a first polysilicon layer deposition. Then the first polysilicon is structured. The nitride cap is stripped, the deep trench poly stud is cleaned and a gate conductor, for example, a second polysilicon layer, Tungsten Silicide (WSi), or nitride is deposited. The gate conductor is etched. An isotropic selective SiGe etch is performed to create a passing wordline on the shallow trench isolation oxide.

Figure 1A:
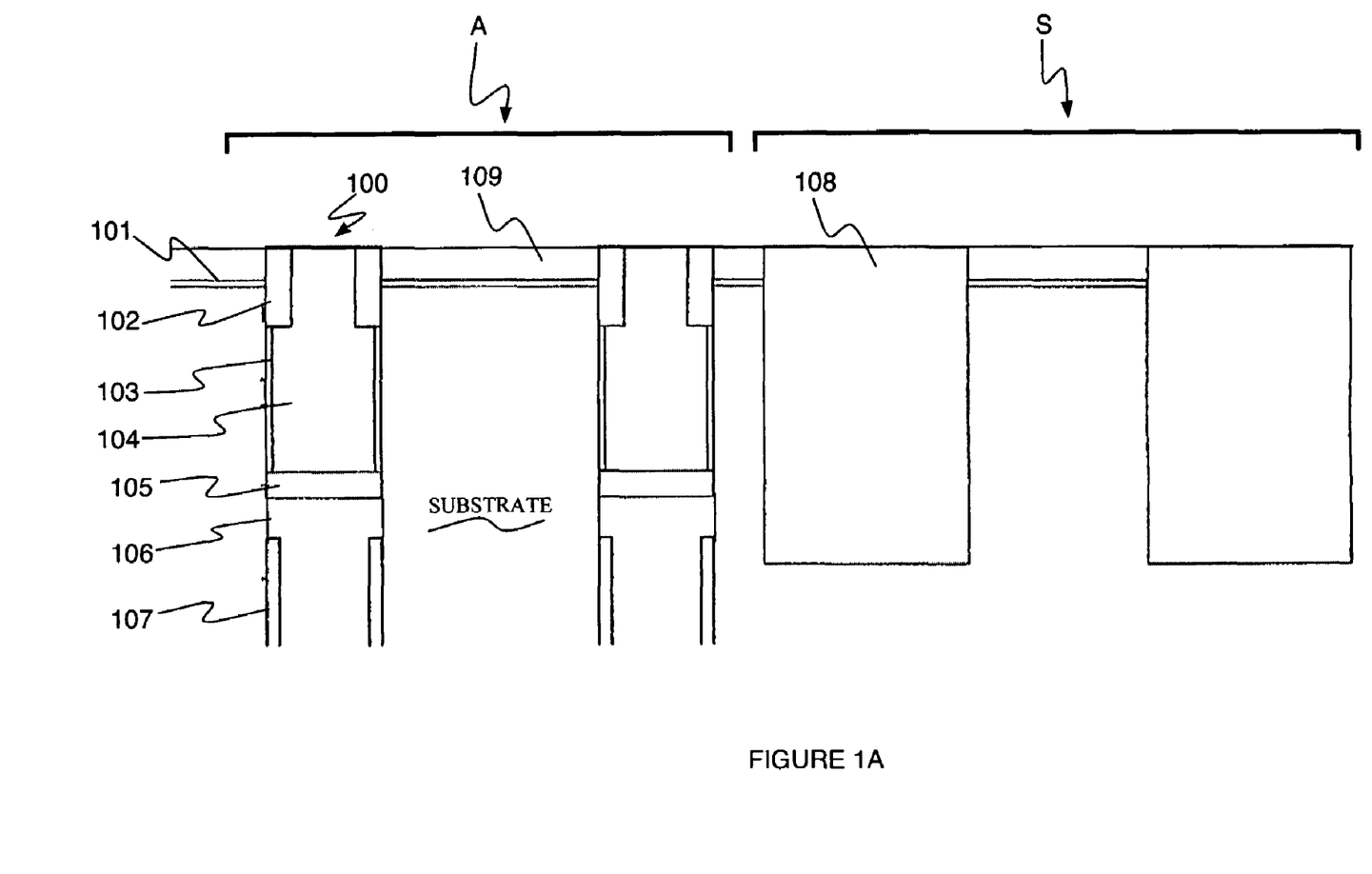
FIG. 1A is a cross-sectional view of array and support areas of a DRAM device.

Referring to FIG. 1A, the device comprises a trench 100 formed in an array area. The device includes an array area A and a support area S. The trench 100 includes a pad oxide 101, inside space nitride 102, vertical gate oxide 103, and vertical gate poly 104. A trench top oxide 105 is formed in the trench 100, below which a buried strap 106 and deep vertical trench (DT) collar 107 are formed. A shallow trench isolation (STI) oxide 108 is formed in a support area.

The array area A includes individual memory cells in a DRAM array, the individual cells include a storage capacitor and a MOS transistor. The storage capacitor and transistor (not shown) for each memory cell are formed within a DT in the substrate of the device. For purposes of illustration, only the topmost portion of the deep trenches is shown. The STI or isolation trench (IT) 108 is shown adjacent to a deep trench in the array area A of the device. Isolation trench 108 serves to provide isolation between active areas of the DRAM device. In addition, the support area S includes isolation trenches 108 to provide isolation between active areas therein.

Figure 1B:
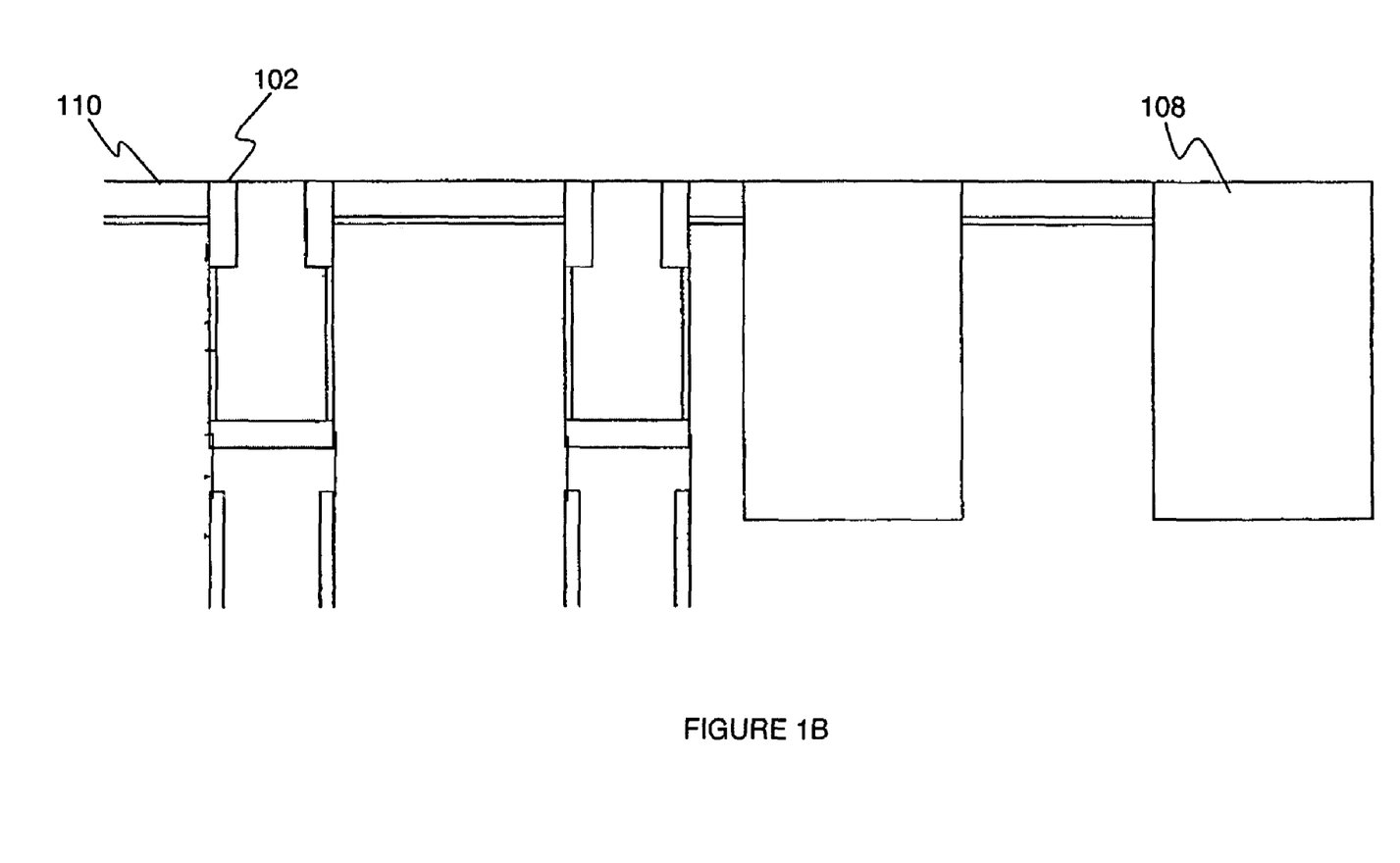
FIG. 1B is an illustration of a post pad nitride strip and array implant according to an embodiment of the present disclosure.

Referring to FIG. 1B, a post pad nitride 109 (see FIG. 1A) is stripped from the surface of the array area and support area. Optionally, the pad nitride can be stripped from the array area only. An array top oxide layer (ATO) 110 of SiGe is deposited and chemical/mechanical planarized to the shallow trench isolation oxide layer 108 and a deep trench poly stud 104.

Figure 1C:
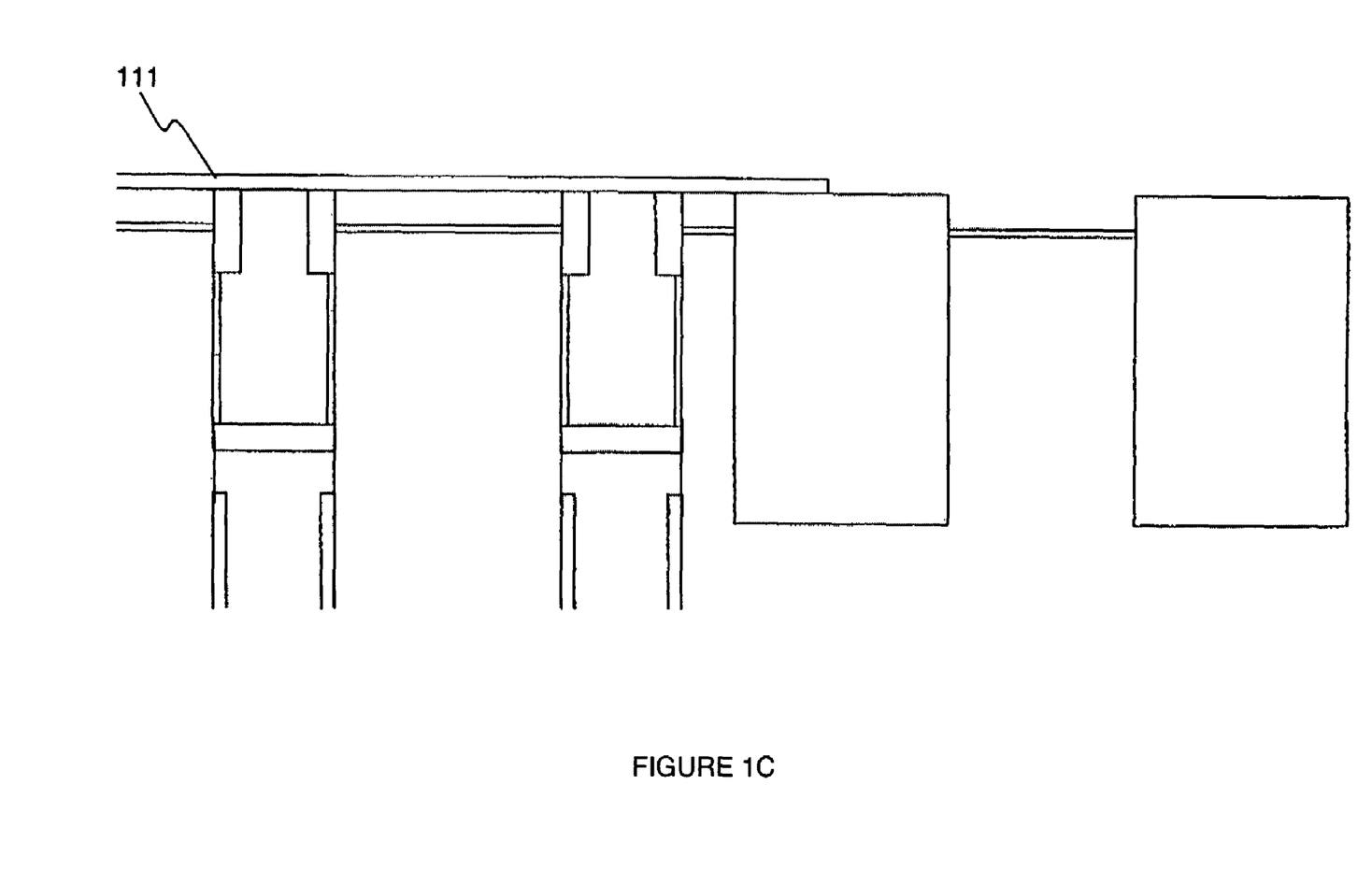
FIG. 1C is an illustration of a Silicon Germanium deposition and chemical/mechanical polish down to shallow trench isolation oxide according to an embodiment of the present disclosure.
Figure 1D:
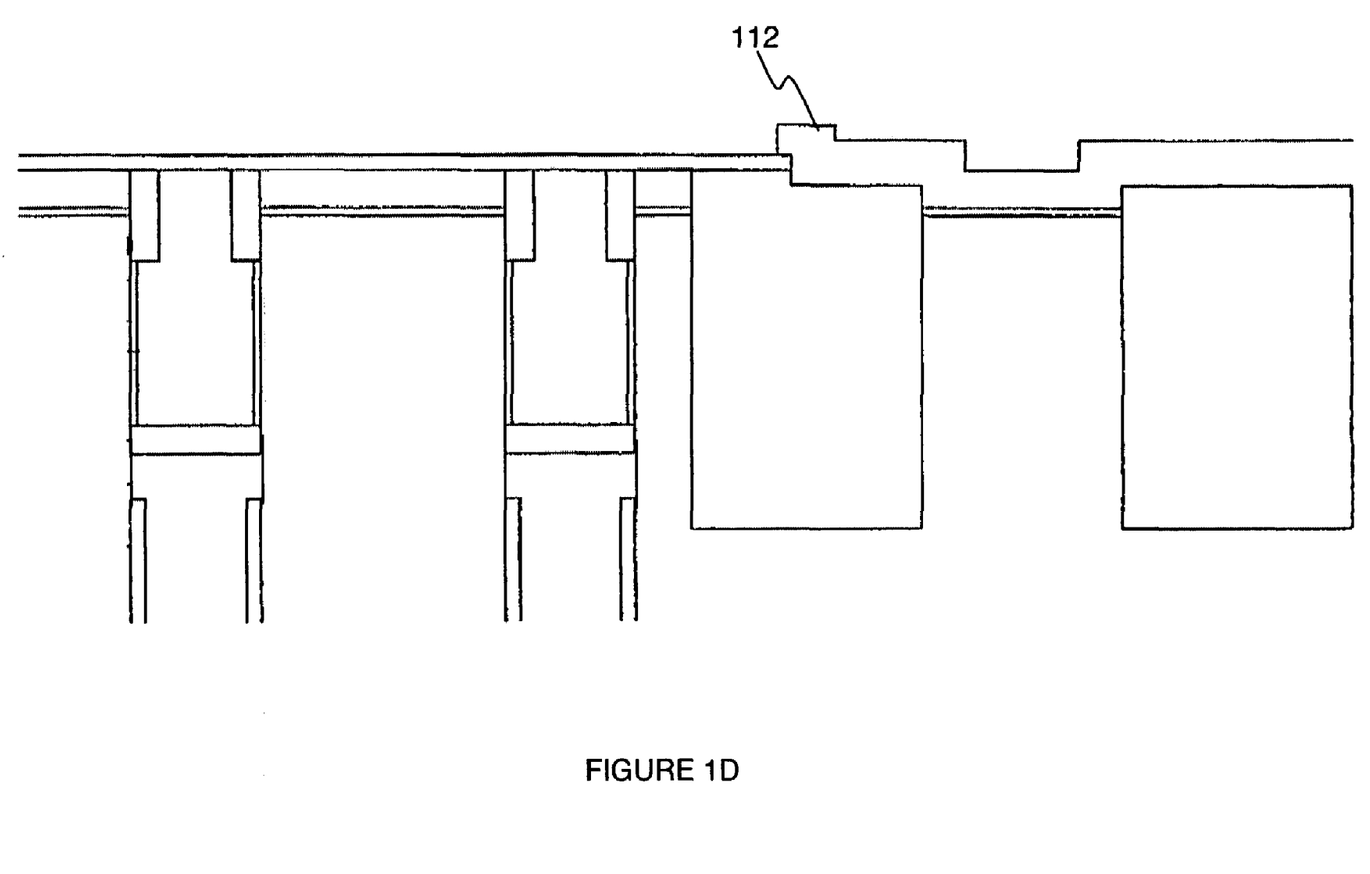
FIG. 1D is an illustration of a nitride cap deposition, structuring and Silicon Germanium poly etch in a support area according to an embodiment of the present disclosure.
Figure 1E:
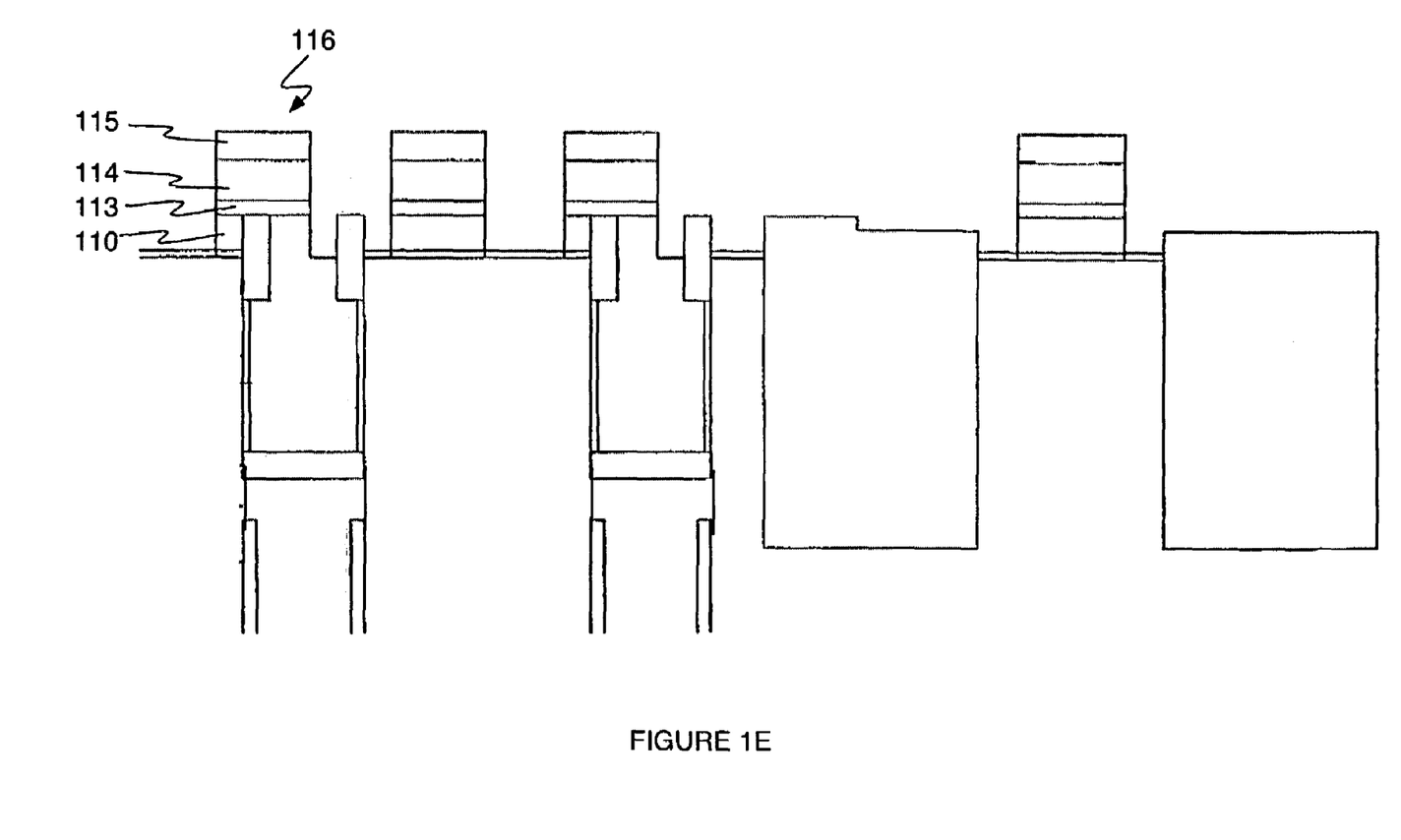
FIG. 1E is an illustration of a support process according to an embodiment of the present disclosure.
Figure 1F:
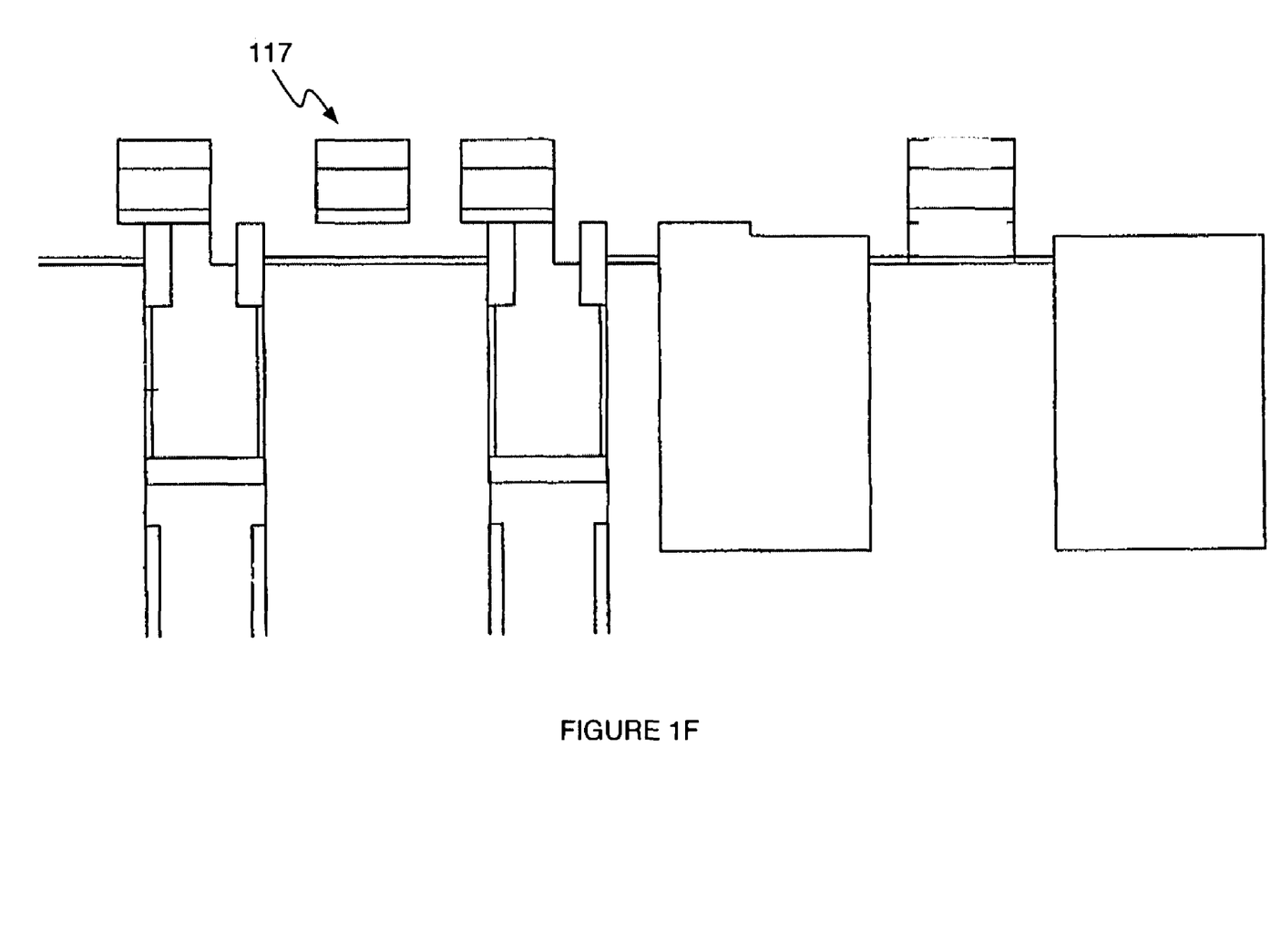
FIG. 1F is an illustration of a nitride cap strip, stud clean, and gate conductor deposition and etch according to an embodiment of the present disclosure.

A nitride cap 11 is deposited and structured in the array area (see FIG. 1C). The SiGe 110 is etched from the support area. As shown in FIG. 1D, in the support area, well implants may be formed, gate oxidation may be performed and a support area polysilicon is deposited 112. The support area polysilicon 112 is structured. The nitride cap 111 is stripped, the deep trench stud is cleaned and a wordline stack 116 is formed. The wordline stack 116 comprises a polysilicon layer 113, a gate conductor 114 and an insulator layer 115, such as a SiN layer, sequentially deposited. The ploysilicon layer 113, gate conductor 114 and SiN layer 115 are etched to form wordline stacks, e.g., 116. An isotropic selective SiGe etch is performed resulting in the formation of a passing wordline bridge 117 on the shallow trench isolation oxide (see FIG. 1F). Processing according to a conventional process. Sidewall oxidation is performed.

In a method for processing a semiconductor memory device, the memory device including an array area and a support area thereon forms a process window for an ATO needed for the isolation of a passing wordline to the active area and a simplification of a middle of line (MOL) integration scheme as it enables the processing of a nitride liner in an oxide etch stop. A passing wordline air-gap may be formed as well as an MOL oxide etch stop nitride liner.

Figure 2:
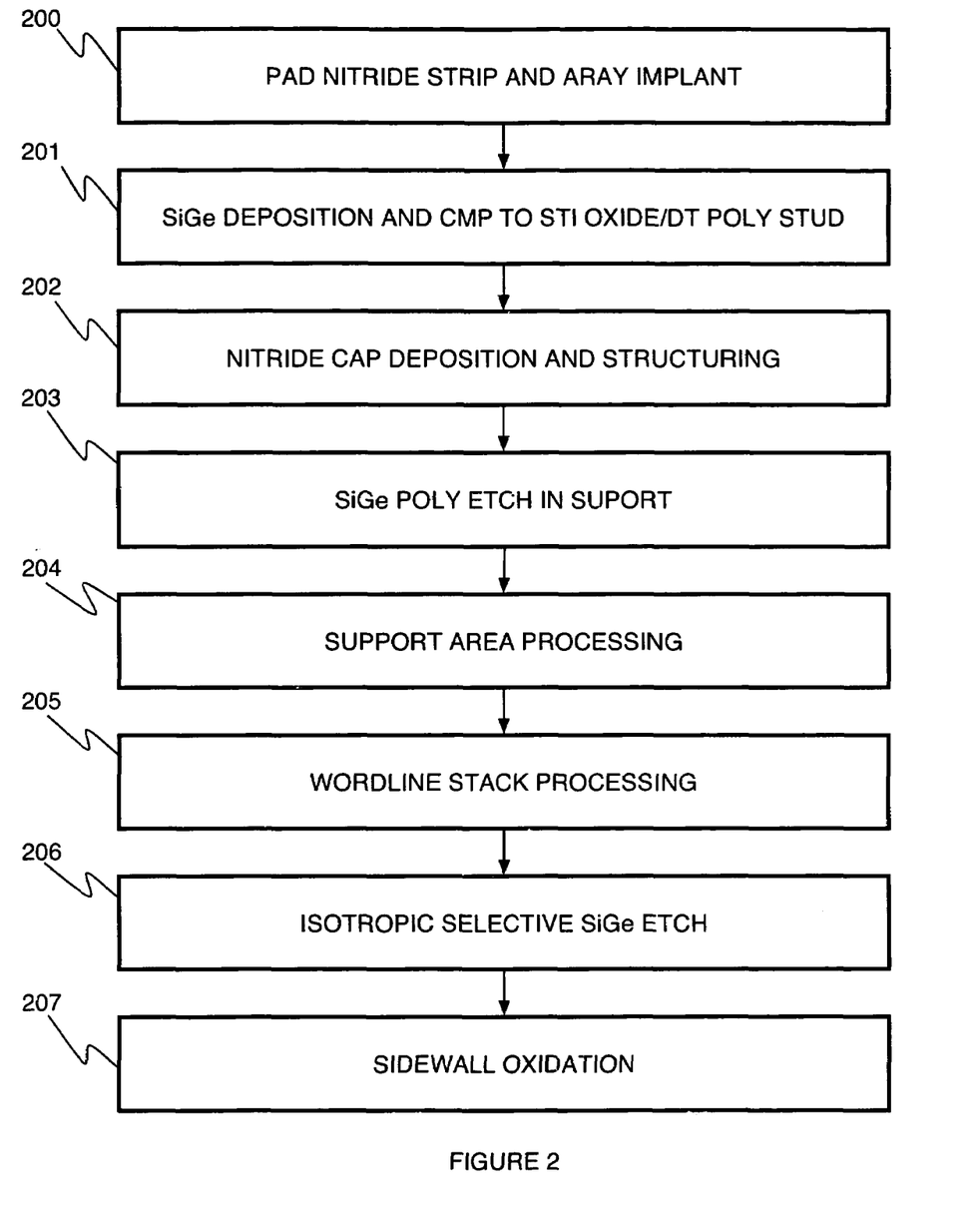
FIG. 2 is a flow chart of a method according to an embodiment of the present disclosure.

Referring to FIG. 2, a method for processing a device includes a post pad nitride strip and array implant 200. Following the nitride strip and array implant, an ATO layer, such as SiGe, is deposited over the array and support areas. Chemical mechanical planarization is done down to the shallow trench isolation oxide layer in the support area and down to the deep trench poly stud in the array area 201. A nitride cap is deposited and structured 202. The SiGe poly is etched in the support area 203. The support area is further processed with well implants, gate oxidation, and a first polysilicon layer deposition 204. The first polysilicon is structured. The nitride cap is stripped, the deep trench poly stud is cleaned and a gate conductor, for example, a second polysilicon layer, WSi, or nitride is deposited. A gate conductor etched is performed 205 to form wordline stacks. The gate conductor etch 205 comprises depositing a photoresist, patterning the photoresist to expose portions of the insulator, and etching the exposed portions of the insulator and the underlying gate conductor, polysilicon and array top oxide.

The gate conductor etch further removes portions of the support area polysilicon. An isotropic selective SiGe etch is performed to create a passing wordline on the shallow trench isolation oxide 206. A sidewall oxidation is performed 207.

Having described embodiments for a gate conductor isolation process of a vertical DRAM cell, it is noted that modifications and variations can be made by persons skilled in the art in light of the above teachings. It is therefore to be understood that changes may be made in the particular embodiments of the invention disclosed which are within the scope and spirit of the invention.

What is claimed is:

1. A method for processing a semiconductor device comprises:
    providing the semiconductor device including a deep trench transistor in an array area and a shallow trench isolation oxide in a support area, wherein a pad oxide and pad nitride are sequentially formed on a semiconductor substrate;
    stripping the pad nitride;
    depositing an array top oxide layer over the semiconductor device;
    planarizing the array top oxide to a top of the shallow trench isolation oxide in the support area and to a deep trench poly stud of the deep trench transistor in the array area;
    forming a wordline stack comprising a polysilicon-layer, a gate conductor and an insulator-formed sequentially on the array top oxide; and
    etching the array top oxide, forming a passing wordline bridge through the array area supported on the shallow trench isolation oxide.

2. The method of claim 1, wherein the pad nitride is stripped from the array area, wherein the pad nitride remains in the support area.

3. The method of claim 1, wherein the pad nitride is stripped from the array area and the support area.

4. The method of claim 1, further comprising depositing a support area polysilicon.

5. The method of claim 1, wherein forming the wordline stack comprises:
    depositing a photoresist;
    patterning the photoresist to expose portions of the insulator; and
    etching the exposed portions of the insulator and the underlying gate conductor, polysilicon and array top oxide.

6. The method of claim 1, wherein the etching removes portions of a support area polysilicon.

* * * * *

UNITED STATES PATENT AND TRADEMARK OFFICE
CERTIFICATE OF CORRECTION

PATENT NO. : 7,101,755 B2  Page 1 of 1
APPLICATION NO. : 10/912005
DATED : September 5, 2006
INVENTOR(S) : Jochen Beintner It is certified that error appears in the above-identified patent and that said Letters Patent is hereby corrected as shown below:

Col. 3, l. 23:  Replace "A nitride cap 11" with --A nitride cap 111--.

Col. 4, l. 30:  Replace "array top oxide" with --array top oxide layer--.

Col. 4, l. 36:  Replace "array top oxide" with --array top oxide layer--.

Col. 4, l. 37:  Replace "array top oxide" with --array top oxide layer--.

Signed and Sealed this

Thirtieth Day of January, 2007

JON W. DUDAS
*Director of the United States Patent and Trademark Office*